United States Patent [19]

Nakata et al.

[11] Patent Number: 5,665,610

[45] Date of Patent: Sep. 9, 1997

[54] SEMICONDUCTOR DEVICE CHECKING METHOD

[75] Inventors: Yoshiro Nakata, Kyoto; Shinichi Oki, Osaka; Koichi Nagao, Osaka; Kenzo Hatada, Osaka; Shigeoki Mori, Kanagawa; Takashi Sato; Kunio Sano, both of Yamanashi, all of Japan

[73] Assignee: Matsushita Electric Industrial Co., Ltd., Osaka, Japan

[21] Appl. No.: 650,486

[22] Filed: May 17, 1996

[30] Foreign Application Priority Data

May 19, 1995 [JP] Japan ................. 7-121008

[51] Int. Cl.$^6$ ............................................. H01L 21/66

[52] U.S. Cl. ......................... 438/18; 438/612; 438/652

[58] Field of Search ........................ 437/7, 8, 183, 437/194, 230; 148/DIG. 162

[56] References Cited

U.S. PATENT DOCUMENTS 5,487,999  1/1996  Farnworth ............................ 437/8
5,508,229  4/1996  Baker ................................ 437/183
5,585,282  12/1996 Wood et al. ........................ 437/183

OTHER PUBLICATIONS

A. Hino et al., "2–layer Flexible Printing Base, Nitto Giho", vol. 28, No. 2, pp. 57–62, Oct., 1990, with English abstract included and drawings with indications in English.

*Primary Examiner*—Chandra Chaudhari
*Attorney, Agent, or Firm*—McDermott, Will & Emery

[57] ABSTRACT

A plated layer made of a metal which is hard to oxidize is formed on the surface of a check electrode of a semiconductor chip which is formed on a semiconductor wafer. A bump of a contactor is caused to come in contact with the check electrode on which the plated layer is formed in the direction perpendicular to the semiconductor chip. Then, a voltage is applied to the bump of the contactor to make a check such as burn-in on the semiconductor chip in a lump.

10 Claims, 5 Drawing Sheets

SEMICONDUCTOR DEVICE CHECKING METHOD

BACKGROUND OF THE INVENTION

The present invention relates to a method for checking a semiconductor device in which integrated circuits of a plurality of semiconductor chips formed on a semiconductor wafer are checked in a lump in the state of the wafer.

Recently, the size of electronic equipment on which a semiconductor integrated circuit device (hereinafter referred to as a semiconductor device) is provided has been considerably reduced and the price has been remarkably lowered. With such improvements, the reduction in size and price of the semiconductor device has been required greatly.

The semiconductor device is usually supplied in the state where a semiconductor chip and a lead frame are electrically connected by a bonding wire and are then sealed by resins or ceramics, and is mounted on a printed board. However, it has been desired that a method for directly mounting, on the circuit board, the semiconductor device which is kept cut out of the semiconductor wafer (hereinafter, the semiconductor device in this state will be referred to as a bare chip) will be developed to meet the demand for reduction in size of the electronic equipment and that the bare chip having a guarantee of quality will be supplied at a low price.

In order to guarantee the quality of the bare chip, it is necessary to make a check such as burn-in on the semiconductor device in the state of a wafer. However, it takes a long time to check a plurality of bare chips formed on the semiconductor wafer one by one or every several ones many times. Thus, such a checking method is not practical in respect of time and costs. Consequently, it is required that a check such as burn-in should be made on a lot of, for example, 1000 or more bare chips in a lump in the state of the wafer.

In order to check the bare chips in a lump in the state of the wafer, it is necessary to simultaneously apply a supply voltage and a signal to the check electrodes of a lot of semiconductor chips formed on the semiconductor wafer so as to operate the semiconductor chips. Consequently, it is necessary to prepare a probe card having a large number of (usually, several thousand or more) probe terminals. A needle type probe card which causes needles to come in contact with check electrodes according to the prior art is not applicable in respect of the number of pins and the price.

A contactor formed of a thin film type probe card has been proposed, in which probe terminals comprising bumps which are connected to the check electrodes of the semiconductor chips are provided on a flexible substrate (see Nitto Giho, Vol. 28, No. 2, Oct. 1990, pp. 57–62).

A method for checking a semiconductor device using the contactor according to the prior art will be described below.

Alignment of the contactor with a semiconductor wafer is performed. Then, the contactor is pressed against the semiconductor wafer. The probe terminals of the contactor are caused to come in contact with the check electrodes of the semiconductor chips. Thereafter, a supply voltage and a signal voltage are applied to the probe terminals. Thus, the semiconductor device is checked.

Ordinarily, the check electrodes of the semiconductor chips are formed of aluminum, its alloy (Al/Si, Al/Si/Cu, etc.) or the like. Therefore, the surface of the check electrode is covered with a surface natural oxide film such as alumina or the like. In order to obtain a good electric connection between the probe terminal of the contactor and the check electrode, it is necessary to press the contactor against the semiconductor wafer to break the surface natural oxide film by the probe terminal of the contactor.

If the number of the semiconductor chips formed on the semiconductor wafer is increased, the number of the probe terminals formed on the contactor is increased so that the press force applied to each probe terminal should be reduced. For this reason, the surface oxide film cannot be broken surely by the probe terminal. Consequently, a contact resistance of the probe terminal to the check electrode is increased and a variation in contact resistance occurs. In other words, it is hard to break the surface oxide film with a load of 10 g per probe terminal in the check electrode on which the ordinary surface oxide film is formed. Accordingly, it is necessary to apply a load of 20 to 30 g per probe terminal or to move the probe terminal in parallel with the main face of the semiconductor chip to perform scrubbing in order to break the surface oxide film surely.

In the case where the contactor is pressed against the semiconductor wafer by vacuum suction force to cause the probe terminal of the contactor to come in contact with the check electrode of the semiconductor chip, a maximum load is 1000 g per square centimeter at an atmospheric pressure. For this reason, if the number of the probe terminals is small, i.e., 50 or less per square centimeter, a load of 20 to 30 g can be kept per probe terminal. If the number of the probe terminals is large, i.e., 50 or more per square centimeter, the load is 20 g or less per probe terminal. For this reason, the surface oxide film of the check electrode cannot be surely broken by the probe terminal. In particular, if the number of the probe terminals is 1000 or more, the above problems turn out notable.

It is possible to apply, to the contactor, a load which is greater than the vacuum suction force. However, if a check is continued over a long period of time while applying a load of 20 to 30 g per probe terminal, the tip portion of the probe terminal is deformed so that the life of use of the contactor is shortened.

By moving the probe terminal in parallel with the main face of the semiconductor chip to perform scrubbing so as to break the oxide film formed on the surface of the check electrode, the probe terminal is badly worn out so that the life of use of the contactor is shortened.

SUMMARY OF THE INVENTION

In consideration of the foregoing description, it is an object of the present invention to surely obtain an electric connection between probe terminals and check electrodes of semiconductor clips by applying a small load per probe terminal without moving the probe terminals in parallel with the main faces of the semiconductor chips to perform scrubbing in the case where a lot of, for example, 1000 or more probe terminals are simultaneously caused to come in contact with the check electrodes of the semiconductor chips formed on a semiconductor wafer in order to check the semiconductor chips in the state of the wafer.

The present invention provides a first method for checking a semiconductor device comprising a first step of forming a check electrode on the main face of a semiconductor chip which is formed on a semiconductor wafer, a second step of forming a plated layer made of a metal which is hard to oxidize on the surface of the check electrode of the semiconductor chip, a third step of causing a probe terminal of a contactor to come in contact with the check electrode on which the plated layer is formed in the state where the probe terminal is not moved in parallel with the main face of the semiconductor chip, and a fourth step of applying a voltage to the probe terminal to check the semiconductor chip in the state where the probe terminal is in contact with the check electrode.

According to the first method for checking a semiconductor device, the plated layer made of a metal which is hard to oxidize is formed on the surface of the check electrode of the semiconductor chip at the second step. Consequently, it is hard to form an oxide film on the surface of the check electrode. At the third step, thus, all the probe terminals and check electrodes can be electrically connected surely by applying a small load to the probe terminals without moving the probe terminals in parallel with the main faces of the semiconductor chips. At the third step, accordingly, all the probe terminals and check electrodes are electrically connected surely by applying the small load to the probe terminals without moving the probe terminals in parallel with the main faces of the semiconductor chips to perform scrubbing. Consequently, the contact resistance of the probe terminal to the check electrode is reduced. Thus, a good check can be made in a lump on the semiconductor chips formed on the semiconductor wafer.

At the third step, it is not necessary to increase a load applied to the probe terminal and move the probe terminal in parallel with the main face of the semiconductor chip to perform scrubbing. Consequently, the tip portion of the probe terminal is neither deformed nor worn out. Thus, the life of use of the contactor can be prolonged.

The present invention provides a second method for checking a semiconductor device comprising a first step of forming a check electrode on the main face of a semiconductor chip which is formed on a semiconductor wafer, a second step of forming a mat plated layer having an uneven surface on the surface of the check electrode of the semiconductor chip, a third step of causing a probe terminal of a contactor to come in contact with the check electrode on which the mat plated layer is formed in the state where the probe terminal is not moved in parallel with the main face of the semiconductor chip, and a fourth step of applying a voltage to the probe terminal to check the semiconductor chip in the state where the probe terminal is in contact with the check electrode.

According to the second method for checking a semiconductor device, the mat plated layer having an uneven surface is formed on the surface of the check electrode of the semiconductor chip at the second step. At the third step, thus, the contact area of the probe terminal with the check electrode is reduced. Consequently, the unevenness of the surface of the mat plated layer is squashed so that a nonconductive oxide film formed on the surface of the mat plated layer is broken by applying a small load to the probe terminal without moving the probe terminal in parallel with the main face of the semiconductor chip to perform scrubbing. Accordingly, all the probe terminals and check electrodes are electrically connected surely. As a result, the contact resistance of the probe terminal to the check electrode is reduced. Thus, the semiconductor chips formed on the semiconductor wafer can be checked well in a lump.

The unevenness is provided on the surface of the check electrode of the semiconductor chip. Consequently, the nonconductive surface oxide film can be broken without increasing a load applied to the probe terminal and moving the probe terminal in parallel with the main face of the semiconductor chip even if the surface of the probe terminal is flat, i.e., the surface of the probe terminal has no unevenness. Thus, the deformation and wear-out of the tip portion of the probe terminal can be prevented. Thus, the life of use of the contactor can be prolonged.

According to the first or second method for checking a semiconductor device, the third step can include a step of causing the probe terminal to come in contact with the check electrode at a room temperature. In other words, all the probe terminals and check electrodes are electrically connected surely even if the probe terminals are caused to come in contact with the check electrodes at a room temperature.

According to the first or second method for checking a semiconductor device, it is preferred that the third step includes a step of causing the probe terminal to come in contact with the check electrode by pressure reducing force. Thus, the load applied to the probe terminal is not increased so that the life of the probe terminal, and furthermore, of the contactor can be prolonged still more.

According to the first or second method for checking a semiconductor device, it is preferred that a check which is made on the semiconductor chip at the fourth step is burn-in. Thus, it is possible to perform the good burn-in on the semiconductor chips in a lump.

According to the first or second method for checking a semiconductor device, it is preferred that the tip face of the probe terminal has an almost flat shape. Thus, the deformation and wear-out of the probe terminal can be prevented still more. Consequently, the life of use of the contactor can be prolonged still more.

These and other objects, features, aspects and advantages of the present invention will become more apparent from the following detailed description of the present invention when taken in conjunction with the accompanying drawings.

DETAILED DESCRIPTION OF THE INVENTION (First Embodiment)

A method for checking a semiconductor device according to a first embodiment of the present invention will be described below with reference to FIGS. 1 to 3.

Figure 1A:
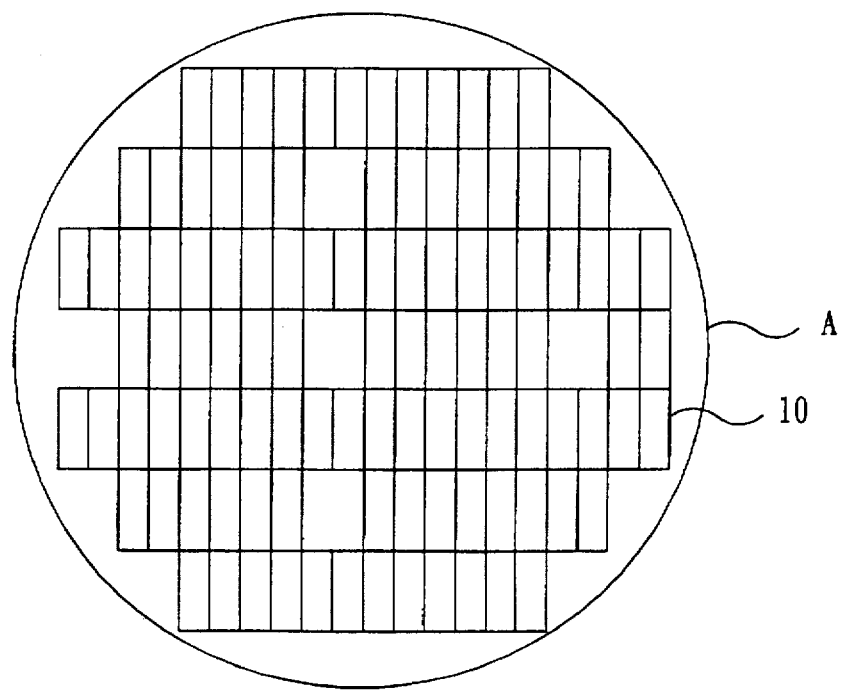
FIG. 1(a) is a plan view showing a semiconductor wafer used for a method for checking a semiconductor device according to each embodiment of the present invention.
Figure 1B:
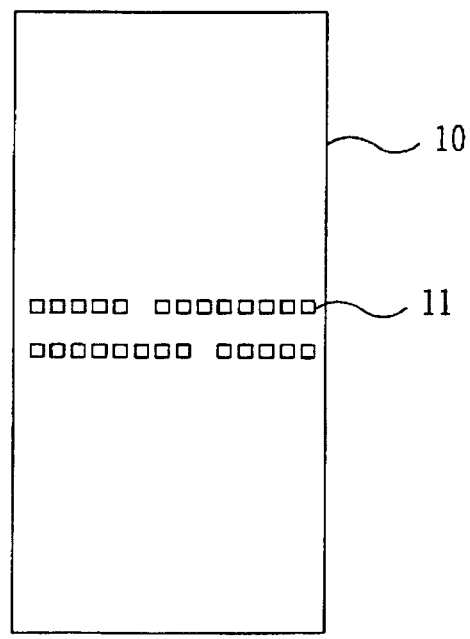
FIG. 1(b) is a plan view showing a semiconductor chip formed on the semiconductor wafer.
Figure 2A:
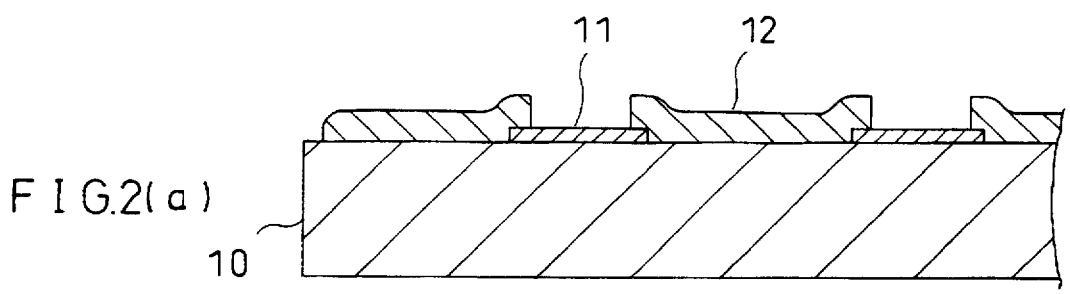
FIGS. 2(a) to (c) are sectional views showing the steps of a method for checking a semiconductor device according to a first embodiment of the present invention.

As shown in FIGS. 1(a) and (b) and FIG. 2(a), a check electrode 11 made of aluminum or copper is formed on the main face of a semiconductor chip 10 formed on a semiconductor wafer A. Then, a surface protection film 12, for example, a $Si_3N_4$ film is then formed so as to expose the check electrode 11.

Figure 2B:
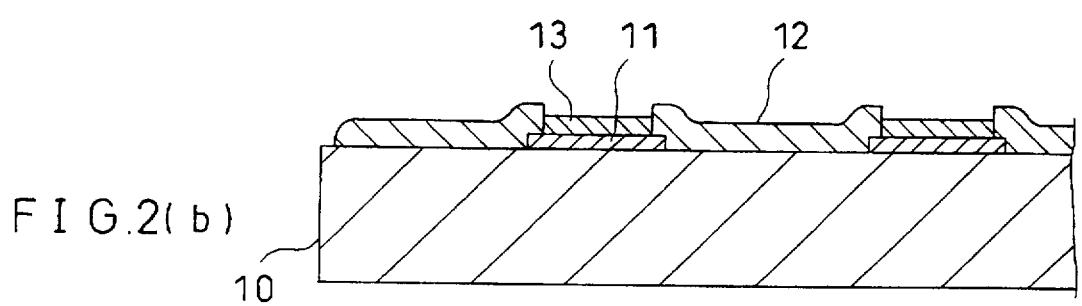

As shown in FIG. 2(b), a plated layer 13 made of a metal which is excellent in conductive property and hard to oxidize is formed on the surface of the check electrode 11. More specifically, the semiconductor wafer A is dipped in oxalic acid (a mixed solution of phosphoric acid, nitric acid and acetic acid) to remove the surface oxide film of the check electrode 11. Then, a Ni film is formed on the surface of the check electrode 11 by using an electroless plating solution comprising a mixed solution of $NiSO_4.6H_2O$ and $NiCl_2.6H_2O$ which contains a small amount of $H_3BO_3$. Then, a Au film is formed on the Ni film by using the electroless plating solution which contains $KAu(CN)_2$ so that the plated layer 13 comprising the Ni film and the Au film is formed.

While the plated layer 13 has a two-layered structure comprising the Ni film and the Au film in the first embodiment, a one-layered structure comprising the Ni film, a Zn film or the Au film may be used.

As described above, the plated layer 13 is formed on the surface of the check electrode 11. Consequently, the check electrode 11 does not come in contact with air so that it is hard to form an oxide film on the surface of the check electrode 11.

Figure 2C:
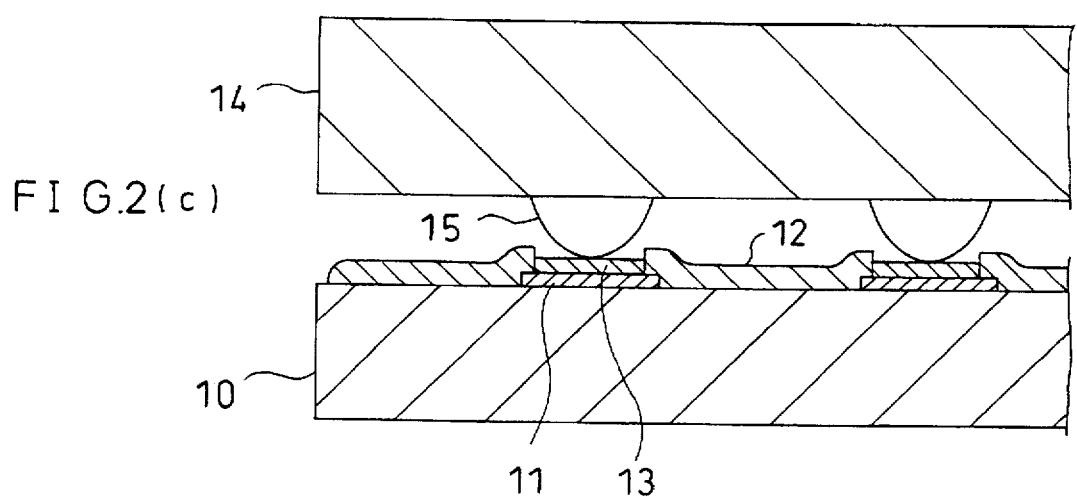

As shown in FIG. 2(c), a hemispherical bump 15 having a radius of about 10 μm or more which is formed on the main face of a contactor 14 made of a polyimide sheet and has an almost flat tip face is caused to come in contact with the check electrode 11 having a surface on which the plated layer 13 is formed. In this case, the surface oxide film is not formed on the check electrode 11. Consequently, all the bumps 15 are electrically connected to the check electrodes 11 surely at a low contact resistance by causing the bumps 15 to come in contact with the check electrodes 11 in the direction perpendicular to the semiconductor chip 10 without moving the bumps 15 in parallel with the main face of the semiconductor chip 10 to perform scrubbing.

While the hemispherical bump 15 has been used as a probe terminal in the first embodiment, a bump having the shape of a square pole, a cylinder, a truncated pyramid or the like whose tip portion is almost flat may be used.

Figure 3A:
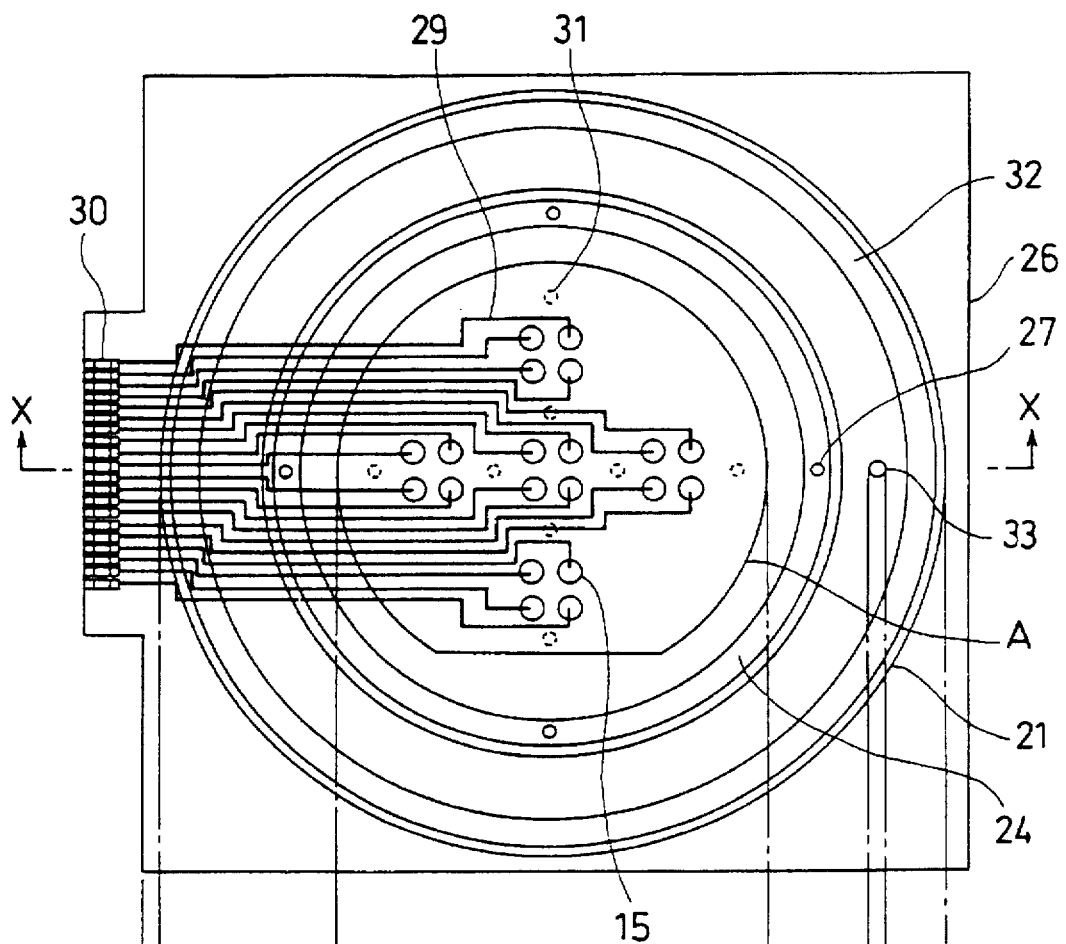
FIG. 3(a) is a plan view showing a semiconductor wafer housing used for the method for checking a semiconductor device according to each embodiment of the present invention.
Figure 3B:
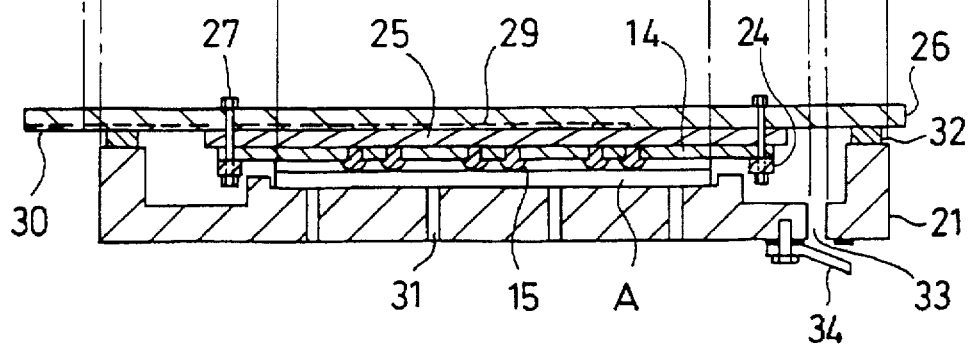
FIG. 3(b) is a sectional view taken along the line X—X shown in FIG. 3(a)

FIGS. 3(a) and (b) show an example of a semiconductor wafer housing for causing the bump 15 of the contactor 14 to come in contact with the check electrode 11 of the semiconductor chip 10. FIG. 3(b) is a sectional view taken along the line X—X shown in FIG. 3(a). In FIGS. 3(a) and (b), the reference numeral 21 designates a holding plate made of ceramics for holding the semiconductor wafer A, the reference numeral 24 designates a ceramic ring for fixing the contactor 14 to the holding plate 21, and the reference numeral 25 designates an anisotropic conductive rubber sheet having a thickness of about 0.5 mm which is provided between the holding plate 21 and the contactor 14. The anisotropic conductive rubber sheet 25 is conducted only in the direction perpendicular to the main face.

In FIGS. 3(a) and (b), the reference numeral 26 designates a wiring board made of ceramics, and the reference numeral 27 designates a fixing screw for fixing the ceramic ring 24 to the wiring board 26. The contactor 14 is fixed to the wiring board 26 with the fixing screw 27. The reference numeral 29 designates a wiring formed in the wiring board 26, and the reference numeral 30 designates an external connector formed on the peripheral portion of the wiring board 26. The bump 15 of the contactor 14 is connected to the external connector 30 through the anisotropic conductive rubber sheet 25 and the wiring 29.

In FIGS. 3(a) and (b), the reference numeral 31 designates a first suction hole formed on the holding plate 21. The semiconductor wafer A is sucked through the first suction hole 31 so that it adheres to the holding plate 21. The reference numeral 32 designates a ring-shaped sealant which is provided on the peripheral portion of the holding plate 21 and elastically shrinks under pressure, the reference numeral 33 designates a second suction hole for reducing the pressure of a sealed space formed by the holding plate 21, the wiring board 26 and the sealant 32, and the reference numeral 34 designates a switching valve for opening and closing the second suction hole 33. When the pressure of the sealed space is reduced through the second suction hole 33, the wiring board approaches the holding plate 21 so that the bump 15 of the contactor 14 surely comes in contact with the check electrode 11 of the semiconductor chip 10 (which are not shown in FIGS. 3(a) and (b)) formed on the semiconductor wafer A. Consequently, the contact resistance of the bump 15 to the check electrode 11 is reduced.

While a check such as burn-in has been made on all the semiconductor chips 10 on the semiconductor wafer A in a lump in the first embodiment, the check may be made on the semiconductor chips 10 on the semiconductor wafer A several times or the check may be made in a lump on the semiconductor chips 10 on the semiconductor wafer A which is divided into several portions.

Figure 4:
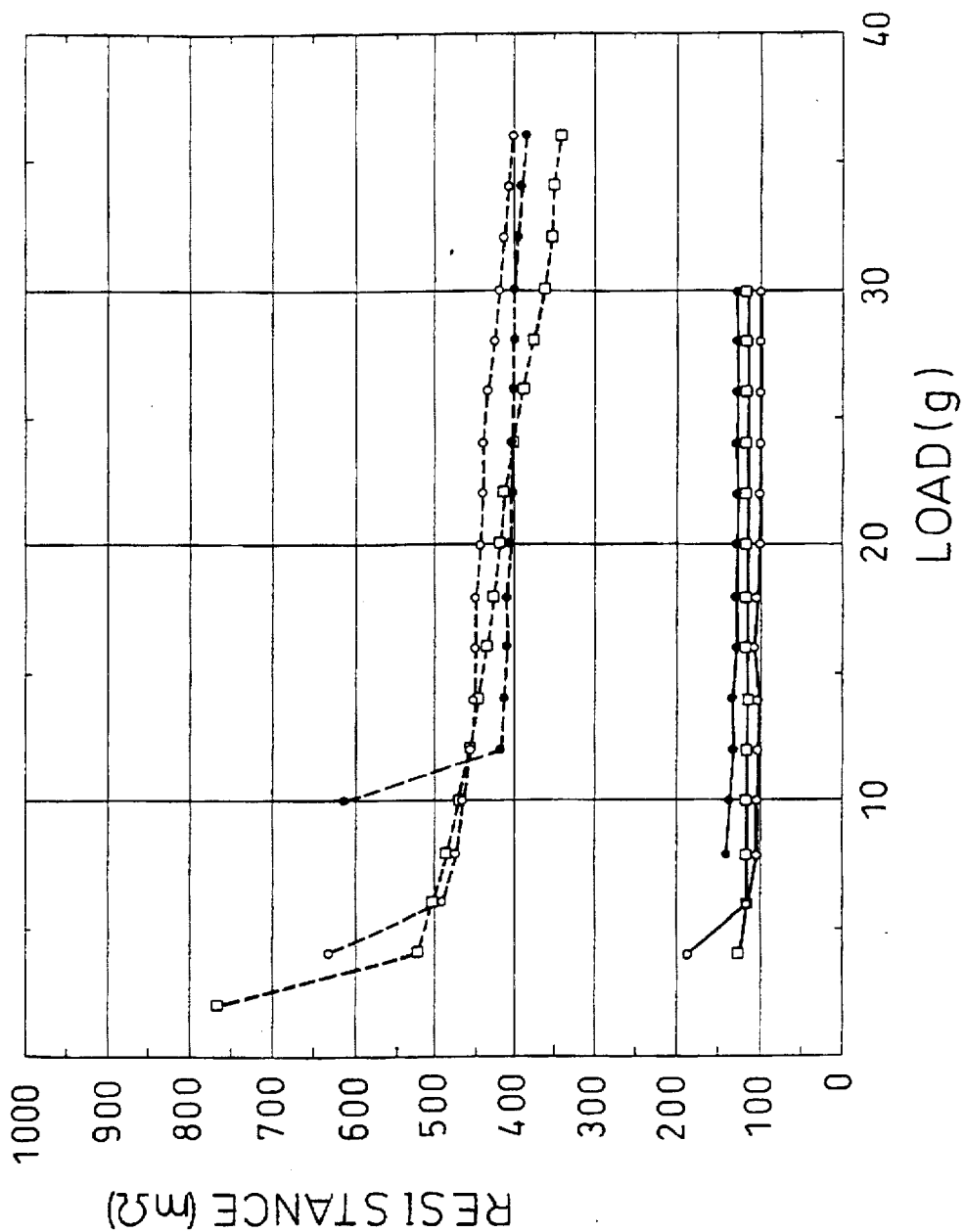
FIG. 4 is a chart showing the results of an evaluation test given for evaluating the present invention.

FIG. 4 is a chart showing the results of an evaluation test given for evaluating the present invention, wherein an axis of abscissa indicates a load applied to each bump and an axis of ordinate indicates the contact resistance of the bump to the check electrode. In FIG. 4, broken lines indicate the prior art in which a plated layer is not provided on the surface of the check electrode and solid lines indicate the first embodiment in which a plated layer made of a Ni film and a Au film is provided on the surface of the check electrode, wherein a measuring current is 1 mA. As is apparent from FIG. 4, the contact resistance is great and has a variation with a load of 10 g or less per bump in the prior art. On the other hand, the contact resistance is small and stable with a load of 10 g per bump in the first embodiment.

(Second Embodiment)

A method for checking a semiconductor device according to a second embodiment of the present invention will be described below with reference to FIG. 5.

Similarly to the first embodiment, a check electrode 11 made of aluminum or copper is formed on the main face of a semiconductor chip 10, and a surface protection film 12, for example, a $Si_3N_4$ film is then formed so as to expose the check electrode 11.

Figure 5:
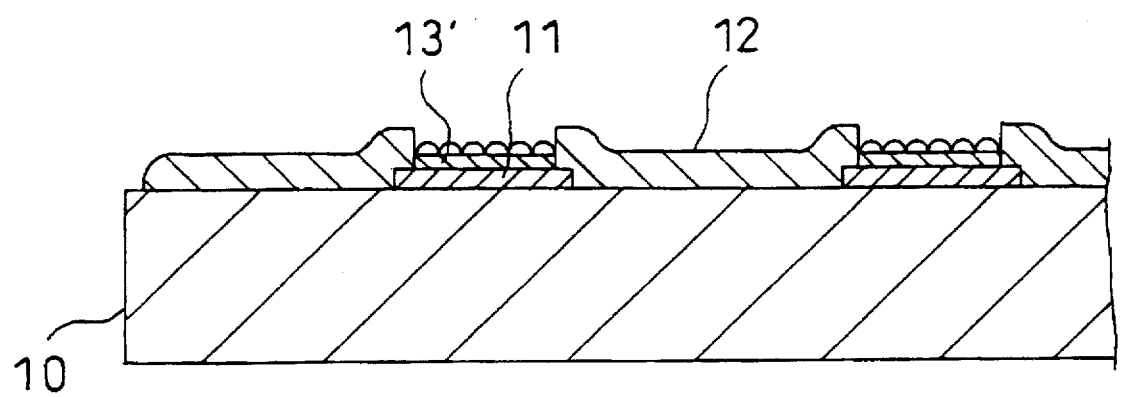
FIG. 5 is a sectional view showing a method for checking a semiconductor device according to a second embodiment of the present invention.

Thereafter, a mat plated layer 13' made of Ni which has a particle size of several to several tens μm and unevenness on the surface thereof is formed on the surface of the check electrode 11 by using an electroless plating solution as shown in FIG. 5. As an example of a method for forming the mat plated layer 13', a method for raising the temperature of a plating solution to increase the reaction rate and the like are generally proposed.

Similarly to the first embodiment, a hemispherical bump 15 formed on the main face of a contactor 14 is caused to come in contact with the check electrode 11 having a surface on which the plated layer 13' is formed.

In this case, the surface of the mat plated layer 13' on the check electrode 11 is oxidized. However, the contact area of the bump 15 with the check electrode 11 is extremely reduced because of the unevenness of the surface of the mat plated layer 13'. Consequently, the surface oxide film of the mat plated layer 13' is broken by applying a load of about several g. Thus, the bump 15 is electrically connected to the check electrode 11 at a low contact resistance.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A method for checking a semiconductor device comprising:
   a first step of forming a check electrode on the main face of a semiconductor chip which is formed on a semiconductor wafer;
   a second step of forming a plated layer made of a metal which is hard to oxidize on the surface of said check electrode of said semiconductor chip;
   a third step of causing a probe terminal of a contactor to come in contact with said check electrode on which said plated layer is formed in the state where said probe terminal is not moved in parallel with the main face of said semiconductor chip; and
   a fourth step of applying a voltage to said probe terminal to check said semiconductor chip in the state where said probe terminal is in contact with said check electrode.

2. The method for checking a semiconductor device of claim 1, wherein said third step includes a step of causing said probe terminal to come in contact with said check electrode at a room temperature.

3. The method for checking a semiconductor device of claim 1, wherein said third step includes a step of causing said probe terminal to come in contact with said check electrode by pressure reducing force.

4. The method for checking a semiconductor device of claim 1, wherein a check which is made on said semiconductor chip at said fourth step is burn-in.

5. The method for checking a semiconductor device of claim 1, wherein the tip face of said probe terminal has an almost flat shape.

6. A method for checking a semiconductor device comprising:
   a first step of forming a check electrode on the main face of a semiconductor chip which is formed on a semiconductor wafer;
   a second step of forming a mat plated layer having an uneven surface on the surface of said check electrode of said semiconductor chip;
   a third step of causing a probe terminal of a contactor to come in contact with said check electrode on which said mat plated layer is formed in the state where said probe terminal is not moved in parallel with the main face of said semiconductor chip; and
   a fourth step of applying a voltage to said probe terminal to check said semiconductor chip in the state where said probe terminal is in contact with said check electrode.

7. The method for checking a semiconductor device of claim 6, wherein said third step includes a step of causing said probe terminal to come in contact with said check electrode at a room temperature.

8. The method for checking a semiconductor device of claim 6, wherein said third step includes a step of causing said probe terminal to come in contact with said check electrode by pressure reducing force.

9. The method for checking a semiconductor device of claim 6, wherein a check which is made on said semiconductor chip at said fourth step is burn-in.

10. The method for checking a semiconductor device of claim 6, wherein the tip face of said probe terminal has an almost flat shape.

* * * * *

UNITED STATES PATENT AND TRADEMARK OFFICE
CERTIFICATE OF CORRECTION

PATENT NO. : 5,665,610
DATED : September 9, 1997
INVENTOR(S) : Nakata et al.

It is certified that error appears in the above-identified patent and that said Letters Patent is hereby corrected as shown below:

<u>Title page,</u>
Item [73], after "Matsushita Electric Industrial Co., Osaka, Japan" insert -- and Tokyo Electron Limited, Tokyo, Japan --.

Signed and Sealed this

Twenty-fifth Day of December, 2001

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 5,665,610
DATED         : September 9, 1997
INVENTOR(S)   : Nakata et al.

It is certified that error appears in the above-identified patent and that said Letters Patent is hereby corrected as shown below:

<u>Title page,</u>
Item [73], after "Matsushita Electric Industrial Co., Ltd., Osaka, Japan" insert
-- and Tokyo Electron Limited, Tokyo, Japan --.

This certificate supersedes Certificate of Correction issued December 25, 2001.

Signed and Sealed this

Twentieth Day of May, 2003

JAMES E. ROGAN
*Director of the United States Patent and Trademark Office*